US010172245B2

(12) United States Patent
Yao et al.

(10) Patent No.: US 10,172,245 B2
(45) Date of Patent: Jan. 1, 2019

(54) SHELL FOR MOBILE DEVICE AND MOBILE DEVICE (71) Applicants: BOE TECHNOLOGY GROUP CO., LTD., Beijing (CN); BEIJING BOE MULTIMEDIA TECHNOLOGY CO., LTD., Beijing (CN)

(72) Inventors: Haiyan Yao, Beijing (CN); Hanzhang Niu, Beijing (CN); Pei Li, Beijing (CN); Yuanfeng Zhang, Beijing (CN)

(73) Assignees: BOE TECHNOLOGY GROUP CO., LTD., Beijing (CN); BEIJING BOE MULTIMEDIA TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/326,003

(22) PCT Filed: Jul. 7, 2016

(86) PCT No.: PCT/CN2016/089097
§ 371 (c)(1),
(2) Date: Jan. 12, 2017

(87) PCT Pub. No.: WO2017/067234
PCT Pub. Date: Apr. 27, 2017

(65) Prior Publication Data
US 2017/0265314 A1 Sep. 14, 2017

(30) Foreign Application Priority Data
Oct. 23, 2015 (CN) .......................... 2015 1 0691768

(51) Int. Cl.
*H05K 7/02* (2006.01)
*H05K 7/04* (2006.01)
(Continued)

(52) U.S. Cl.
CPC .......... *H05K 5/0065* (2013.01); *H01R 24/62* (2013.01); *H04M 1/72527* (2013.01);
(Continued)

(58) Field of Classification Search
CPC .. H05K 5/0065; H05K 5/0086; H05K 5/0217; H01R 2107/00; H01R 24/62
(Continued)

(56) References Cited

U.S. PATENT DOCUMENTS 7,650,007 B2 * 1/2010 Iuliis .......................... A45F 5/00
381/374
8,646,698 B2 * 2/2014 Chen .................... H04B 1/3888
235/435
(Continued)

FOREIGN PATENT DOCUMENTS

CN 203289499 U 11/2013
CN 203326641 U 12/2013
(Continued)

OTHER PUBLICATIONS

International Search Report and Written Opinion in PCT/CN2016/089097 dated Sep. 29, 2016, with English translation. 16 pages.

*Primary Examiner* — Hung S Bui
(74) *Attorney, Agent, or Firm* — Womble Bond Dickinson (US) LLP (57) ABSTRACT

The shell for a mobile device comprises one or more functional modules attached to the shell and a connector, the functional module being capable of being electrically connected to the mobile device via the connector and a first interface of the mobile device, for providing a corresponding function for the mobile device. Such a shell can not only provide protection function for the mobile device but also can enhance the performance of the mobile device, enrich
(Continued)

the function of the mobile device and promote the user's experience in using the mobile device.

17 Claims, 3 Drawing Sheets

(51) Int. Cl.
*H05K 5/00* (2006.01)
*H01R 24/62* (2011.01)
*H05K 5/02* (2006.01)
*H04M 1/725* (2006.01)
*H01R 107/00* (2006.01)
*H04M 1/18* (2006.01)

(52) U.S. Cl.
CPC ......... *H05K 5/0086* (2013.01); *H05K 5/0217* (2013.01); *H01R 2107/00* (2013.01); *H04M 1/185* (2013.01)

(58) Field of Classification Search
USPC ................ 361/816, 818, 799, 807, 809, 810
See application file for complete search history.

(56) References Cited

U.S. PATENT DOCUMENTS

| | | | |
|---|---|---|---|
| 8,774,716 B2* | 7/2014 | Chan | H04B 5/0062 235/492 |
| 9,716,524 B2* | 7/2017 | Rostami | H04B 1/3888 |
| 9,761,927 B2* | 9/2017 | Kasar | H01Q 1/243 |
| 2007/0154048 A1* | 7/2007 | Chang | H04M 1/05 381/371 |
| 2007/0279852 A1* | 12/2007 | Daniel | A44C 5/0007 361/679.03 |
| 2011/0016494 A1* | 1/2011 | Linhardt | H04N 21/41407 725/62 |
| 2014/0346064 A1 | 11/2014 | Gao | |
| 2015/0172431 A1* | 6/2015 | Huang | H04B 1/3888 455/556.1 |

FOREIGN PATENT DOCUMENTS

| | | |
|---|---|---|
| CN | 204031641 U | 12/2014 |
| CN | 204391825 U | 6/2015 |
| CN | 205017751 U | 2/2016 |

\* cited by examiner

SHELL FOR MOBILE DEVICE AND MOBILE DEVICE

RELATED APPLICATIONS

The present application is the U.S. national phase entry of PCT/CN2016/089097, with an international filling date of Jul. 7, 2016 which claims the benefit of Chinese Patent Application NO. 201510691768.2, filed on Oct. 23, 2015, the entire disclosure of which is incorporated herein by reference.

FIELD OF THE INVENTION

The present disclosure relates to a shell, more particularly, to a shell for protecting a mobile device and a mobile device comprising such a shell.

BACKGROUND

With the development and progress of technologies, various mobile devices such as mobile phones, panel computers, personal digital assistant and music players have become popular increasingly and bring great convenience and assistance for people's life. The mobile device generally obtains power from a rechargeable battery to maintain operation. However, the power provided by the battery of the mobile device itself is often very limited, particularly, the smart mobile device that rises in recent years with various functions has extremely large power consumption, and also has high power consumption rate, hence, the mobile devices generally confront the problem of short battery duration and high charge frequency. In addition, although the mobile device is typically provided with a built-in storage device, in certain cases, the storage capacity of such a built-in storage device still cannot meet people's requirement for data storage. On the other hand, in order to use and protect the mobile device better, shells for protecting various mobile devices dedicatedly have also been designed and applied. Some protection shells have also been designed to improve the appearance of the mobile device. However, such shells still play very limited functions. Therefore, the existing mobile devices still need to be improved in terms of performance, user experience, etc.

SUMMARY

The embodiment of the present invention provides a shell for a mobile device, so as to mitigate or alleviate at least some of the problems mentioned above.

According to an embodiment of the invention, a shell for a mobile device is provided. The shell comprises one or more functional modules attached to the shell and a connector. The functional module is capable of being electrically connected to the mobile device via the connector and a first interface of the mobile device, for providing a corresponding function for the mobile device.

As stated hereinafter, the present disclosure does not limit the specific forms of the functional module. As an example while not limiting the present invention, such functional modules can comprise one or more of a power supply module, a storage module, a speaker module, and a sensing module. The power supply module for example can be a battery or a micro power generation device. When the battery of the mobile device itself has insufficient power, the power supply module can supplement power to the battery of the mobile device, so as to prolong the battery duration for the mobile device, which is beneficial to prolong the battery life of the mobile device. The storage module can serve as a backing storage space of the mobile device, so as to provide additional storage space for the user in the event that the built-in storage device of the mobile device cannot meet the user's requirements. The speaker module can provide sound release function for the mobile device so as to meet the user's requirement in occasions where relatively large released sound is required. The sensing module can comprise various sensors for sensing the user body data or environment data, and can upgrade or enrich the functions of the mobile device in cooperation with related applications (APP), so as to meet individual requirements of the user. Therefore, by arranging related functional modules on the shell, it can not only provide protective functions for the mobile device but also can enhance performance of the mobile device, enrich the functions of the mobile device, and promote the user experience in using the mobile device.

In an embodiment, the first interface of the mobile device comprises an USB (Universal Serial Bus) interface. The connector of the shell comprises an USB connector matched with the USB interface. The USB interface is a currently popular communication interface for the mobile device, hence, the shell provided by the embodiment of the present invention makes use of the USB interface of the mobile device itself in a simple and efficient manner, thereby achieving double effects of protecting the mobile device and enhancing the function or performance for the mobile device.

In an embodiment, the functional module can be electrically connected with the USB connector via an USB connecting line. The USB connecting line is arranged within the shell or arranged on an inner surface of the shell.

In an embodiment, the functional module is arranged within the shell. Thus, the structure of the shell can be simplified and the conciseness of the shell can be enhanced.

According to embodiments of the present invention, other forms of attaching the functional module to the shell are further provided. For example, in an embodiment, an inner surface of the shell can have one or more grooves corresponding to the functional modules for accommodating the functional modules respectively. Alternatively, an outer surface of the shell can have one or more grooves corresponding to the functional modules for accommodating the functional modules respectively.

Further, the shell can further comprise a sub-shell for covering all of the functional modules. In an embodiment, such a sub-shell can be detachably connected with other portions of the outer surface or the inner surface of the shell in cooperation, so as to form a flat outer surface or inner surface of the shell.

Further, the functional module is detachably arranged within the groove.

Further, the shell can have a fixing component situated in the groove for fixing a corresponding functional module in the groove.

Alternatively, the groove can have a first component, and the functional module can have a second component. The first component and the second component can cooperate with each other so as to fix the functional module in the groove.

Alternatively, the functional module can have an electro permanent magnet, and a magnetic material is provided at a bottom surface or a side surface of the groove or within the shell corresponding to the groove. Therefore, in this embodiment, by means of the electro permanent magnet technology, automatic fixation or separation of the functional module and the shell can be achieved, so as to facilitate operation and use for the user and further promote user experience in using the mobile device.

In another embodiment, the shell can further comprise a second interface for being electrically connected with an external device, the external device being capable of operating or accessing a corresponding functional module via the second interface.

Further, the second interface can comprise a second USB interface, and the second USB interface and the USB connector can extend from the shell via connecting lines.

In a further embodiment, the sensing module can comprise a sensor for measuring user body data, motion data or environment data. Different types of sensors can be configured selectively based on user requirements or attention, or a plurality of different types of sensors can be arranged simultaneously so as to meet personalized requirement of the user.

In a further embodiment, the shell can comprise a substrate for protecting a back of the mobile device. The functional module is attached to the substrate. Thus, this embodiment can provide a shell in the form of a single plate.

In a further embodiment, the shell can comprise a first substrate and a second substrate capable of protecting a front and a back of the mobile device respectively. The functional module can be attached to one or two of the first substrate or the second substrate. The first substrate and the second substrate are movably connected.

According to a further embodiment of the present invention, a mobile device is provided. The mobile device can comprise a shell as described in any of the preceding embodiments. Such mobile devices can be a handheld electronic device of any type, including but not limited to a mobile phone, a panel computer, a personal digital assistant, a music player, a navigator etc.

According to embodiments of the present invention, by arranging related functional modules on the shell, it can not only provide protective functions for the mobile device but also can enhance performance of the mobile device, enrich the functions of the mobile device, and promote the user experience in using the mobile device.

BRIEF DESCRIPTION OF THE DRAWINGS

Next, embodiments of the present invention will be described with reference to the drawings in more details and through nonrestrictive examples, wherein.

DETAILED DESCRIPTION OF EMBODIMENTS

Next, specific embodiments of the present invention will be explained in detail by way of examples. It should be understood that the embodiments of the invention are not limited to the examples below. The skilled person in the art can make amendments and modifications to the embodiments as disclosed by means of the principle or spirit of the invention so as to obtain other embodiments in different forms. Apparently, these embodiments all fall within the protection scope of the invention.

In addition, it should be noted that the drawings referenced in this specification are for the demand of illustrating and explaining the embodiments of the invention. The shape and size of each component and connection between different components represented by the drawings are only used for schematically explaining embodiments of the invention, rather than constituting limitations to the scope of the invention. Moreover, the words "first", "second" and so on used in this text do not limit the number of the related components, but for distinguishing different components with the same names.

According to embodiments of the invention, a shell for a mobile device is provided. The shell comprises one or more functional modules attached to the shell and a connector. The functional module is capable of being electrically connected to the mobile device via the connector and a first interface of the mobile device, for providing a corresponding function for the mobile device.

The functional module mentioned herein refers to a module for providing a function not provided by any component of the mobile device itself for the mobile device. Such a functional module includes but not limited to a power supply module, a storage module, a sensing module, a speaker module, etc., which will not be limited by the present disclosure. Therefore, the functions provided by these functional modules can be same as the existing functions of the mobile device, for example, the power supply module and the storage module can provide electrical energy and storage space for the mobile device respectively. However, they can also be other functions that the mobile device may not possess, for example, a sensing module for sensing body data of a user or environment data. In the following, the function module will be explained specifically through examples.

Moreover, the shell for a mobile device mentioned herein can serve as a shell of the mobile device for directly protecting the circuits or components within the device, i.e., the shell provided by embodiments of the invention is designed as a shell necessary for the mobile device, for example, the back shell of a mobile phone or a panel computer, etc. Alternatively, the shell provided by embodiments of the invention can also be designed as a shell for providing protective function for the whole mobile device dedicatedly, for example, a protective sleeve or a protective case for an electronic device such as a mobile phone, a panel computer, etc.

Figure 1:
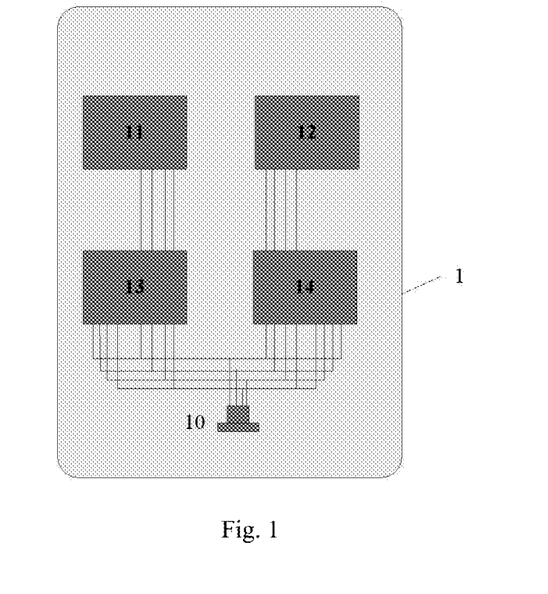
FIG. 1 illustrates a structural view of a shell for a mobile device according to one or more embodiments of the invention.

FIG. 1 shows a specific embodiment of the invention. As shown in FIG. 1, a shell 1 for a mobile device comprises four functional modules attached to the shell 1 and a connector 10. The four functional modules may comprise a power supply module 11, a storage module 12, a sensing module 13 and a speaker module 14 respectively. These functional modules can be electrically connected to the mobile device via the connector 10 and a first interface of the mobile device, for providing corresponding functions for the mobile device.

As stated above, the present disclosure does not limit the specific form of the functional module. Any types of functional modules can be arranged in the shell based on user requirements. As an example, the embodiment as shown in FIG. 1 only shows the above four functional modules. Apparently, in other embodiments, only one or more of the above four functional modules can be arranged as needed, alternatively, other functional modules in addition to the above four functional modules can be arranged, for example, a sound recording module for recording sound, a remote control module for controlling other devices, etc.

The power supply module 11 includes but not limited to a battery. In an embodiment, the battery as the power supply module 11 can be designed with a relatively small thickness or size, so as to be attached and fixed to the shell 1 conveniently, and reduce the weight of the shell. In another embodiment, the power supply 11 can also be a micro power generation device capable of converting kinetic energy into electrical energy, e.g., a nano-generator. When the user performs motion or moves forward carrying the mobile device, the micro power generation device can convert the kinetic energy generated by shaking or moving of the mobile device into electrical energy so as to be stored. The storage module 12 may be a memory card or a memory chip, serving as a backing storage space for the mobile device, so as to provide additional storage space for the user in the event that the built-in storage device of the mobile device itself cannot meet the user requirements. The speaker module 13 can provide sound release function for the mobile device, so as to meet the user's requirement in occasions where relatively large released sound is required. For example, for a mobile device without the radio function, a related application (APP) can be installed on the mobile device. The combination of the speaker module and this application can provide the radio function for the mobile device.

Therefore, by arranging related functional modules on the shell, it can not only provide protective functions for the mobile device but also can enhance performance of the mobile device, enrich the functions of the mobile device, and promote the user experience in using the mobile device.

The existing mobile device generally comprises an USB interface, e.g., a mini USB interface. Such an interface also often serves as the charge interface or data transmission interface of the mobile device. Hence, in an embodiment of the present invention, the first interface of the mobile device may comprise an USB interface. The connector of the shell comprises an USB connector matched with the USB interface, e.g., an USB header matched with the USB interface. In this way, by means of the existing interface of the mobile device, electrical connection and data communication between the mobile device and the modules on the shell can be easily achieved.

Further, the functional module can be electrically connected with the USB connector via an USB connecting line, and the USB connecting line can be arranged within the shell or arranged on an inner surface of the shell. The functional module is electrically connected with the USB connector via the USB connecting line, then the USB connector is electrically connected with the first interface of the mobile device, thereby enabling the functional module to be electrically connected with the mobile device. In an embodiment, USB connecting lines are arranged in the shell for the mobile device, which enables the shell to protect the USB connecting lines well, meanwhile, it can improve conciseness and appearance for the shell. It should be noted that in the embodiment as shown in FIG. 1, the connecting lines are shown in order to illustrate the electrical connection between respective modules and the USB connector 10 clearly, in practice, these connecting lines may be arranged within the shell 1, i.e., they can be hidden in the shell. Certainly, in other embodiments, the USB connecting lines may be bond and fixed to the shell, when the shell is mounted to the mobile device, the USB connecting lines can also be invisible.

According to embodiments of the invention, there are various ways of attaching the functional modules to the shell. Several ways of attaching the functional modules to the shell will be explained through examples in the following.

In an embodiment, the functional module may be arranged within the shell. In other words, the functional module can be arranged between the inner surface and the outer surface of the shell, for example, at the middle of the thickness of the shell. Here, the inner surface and the outer surface of the shell can enclose the functional modules completely. The functional modules can be electrically connected with the USB connector via the USB connecting lines within the shell. On the surface, the functional modules within the shell are even invisible. In this way, it not only enables the shell to protect the interior functional modules well but also simplifies the structure of the shell.

Alternatively, in another embodiment, in order to attach the respective functional modules to the shell, the inner surface of the shell may have one or more grooves corresponding to the functional modules for accommodating the functional modules. In other embodiments, the outer surface of the shell may have one or more grooves corresponding to the functional modules for accommodating the functional modules. The size of each groove can match with the corresponding functional module so as to enable the functional module to be embedded in the groove. In this way, these functional modules can be easily taken out from the shell so as to facilitate mounting and replacement of the functional modules.

Further, in the case of arranging grooves for accommodating the functional modules on the inner surface or the outer surface of the shell, the shell may further comprise a sub-shell for covering all of the functional modules. In an embodiment, such a sub-shell may be detachably connected with portions of the inner surface or outer surface of the shell other than the grooves in cooperation, so as to form a flat inner surface or outer surface of the shell. Hence, such a sub-shell may provide protection for the functional modules, and help to attach the functional modules to the shell firmly, without influencing overall conciseness of the shell for the mobile device.

In an embodiment, the functional modules may be detachably arranged in the grooves. In this way, the corresponding functional module can be taken out from the groove conveniently, so as to replace or maintain the functional module, for example, the power supply module can be taken out for charging.

With respective functional modules accommodated in the grooves, they can be fixed to the grooves or be mechanically connected with the grooves in many ways, so as to enable the respective functional modules to be fixed to the shell more firmly.

In an embodiment, the shell can have a fixing component situated in the groove. The fixing component can fix the corresponding functional module in the groove. For example, a pressing structure protruding from the side wall or an edge of the groove can be arranged. After the functional module is placed in the groove, the pressing structure can press the edge or a portion of the surface of the functional module so as to enable the functional module to be pressed tightly in the groove. Such a pressing structure may be a small elastic protrusion or a moveable plate-like structure, thereby being capable of facilitating fixation for the functional module in the groove by means of the pressure of the small protrusion or the plate-like structure. The fixing component that can be used in the embodiment of the invention is not limited to the above pressing structure, fixing component in any other appropriate forms are possible, as long as it can fix the functional module in the groove. For example, the fixing component may be a component fixedly connected to the groove, and can also be a detachable fixing component such as an elastic fastener, a screw, etc.

In another embodiment, the groove may have a first component, and the functional module may have a second component. The first component and the second component may cooperate with each other to fix the functional module in a corresponding groove, so as to enable the respective functional modules to be attached to the shell more firmly. For example, semi-circular protrusions can be designed within the groove, and semi-circular recesses can be arranged at two sides of a corresponding functional module, under the effect of an external force, the semi-circular protrusions can be buckled with the semi-circular recesses closely, thereby fixing the corresponding functional module to the shell more firmly. For example again, protruded guide rails may be arranged in the groove of the shell, and recessed guide rail grooves in which push-and-pull can be executed may be arranged at two sides of the functional module. After the recessed guide rail grooves of the corresponding functional module are aligned with the protruded guide rails, the functional module can be pushed in, so as to enable the functional module to be fixed in the groove. On the contrary, when the functional module has to be separated from the shell, the functional module can be pushed outwards in a reverse direction so as to be taken out from the shell.

The first component or the second component mentioned in embodiments of the invention is not limited to the above specific structure, which can be a component in any other appropriate forms, as long as the first component and the second component can cooperate with each other so as to fix the functional module in the corresponding groove.

In another embodiment, the functional module may have an electro permanent magnet, and a magnetic material can be provided at a bottom surface or a side surface of the groove or within the shell corresponding to the groove. The electro permanent magnet can also be called electrically controlled permanent magnet. Based on different characteristics of different permanent magnet materials, the distribution of the internal magnetic circuit of the electro permanent magnet may be controlled and switched by an electrically control system, so as to enable the permanent magnetic field to be balanced within the system, i.e., the electro permanent magnet is in a demagnetization state (non-attractive state), or enable the permanent magnetic field to be released to a surface of the working magnetic pole of the electro permanent magnet, in this case, the electro permanent magnet is in a magnetizing state (attractive state). Hence, by enabling the functional module to have an electro permanent magnet (e.g., being arranged at the bottom of the functional module), and the magnetic material to be provided at the bottom surface or side surface of the groove or within the shell corresponding to the groove, and controlling the electro permanent magnet with the corresponding electrically control system so that it is in a demagnetizing state or a magnetizing state, automatic fixation and separation of the functional module and the shell can be achieved, which is convenient for the user to operate and use, and can promote the user experience in using the mobile device. Such an electrically control system for controlling the electro permanent magnet is well known in the art, which will not be repeated here.

It should be understood that in some embodiments, the functional module and the groove can also be provided with metal contacts or elements in contact with each other. The metal contacts or elements on the groove can be electrically connected with the USB connecting lines, so as to realize electrical connection of the functional module and the USB connecting lines. Other ways known by the skilled person in the art can also be used to realize electrical connection of the functional module and the USB connecting lines, which will not be repeated here.

The shell for a mobile device provided by the embodiment of the invention is not limited to a specific shape or structure, instead, the shell may have different shapes or structures with respect to specific mobile devices to which it is applied. In other words, the shell could be customized based on the type or shape of the specific mobile device. Moreover, with respect to mobile devices of the same type, shells of different shapes or structures can be designed, as long as such shells can be applied to the mobile device.

Figure 2:
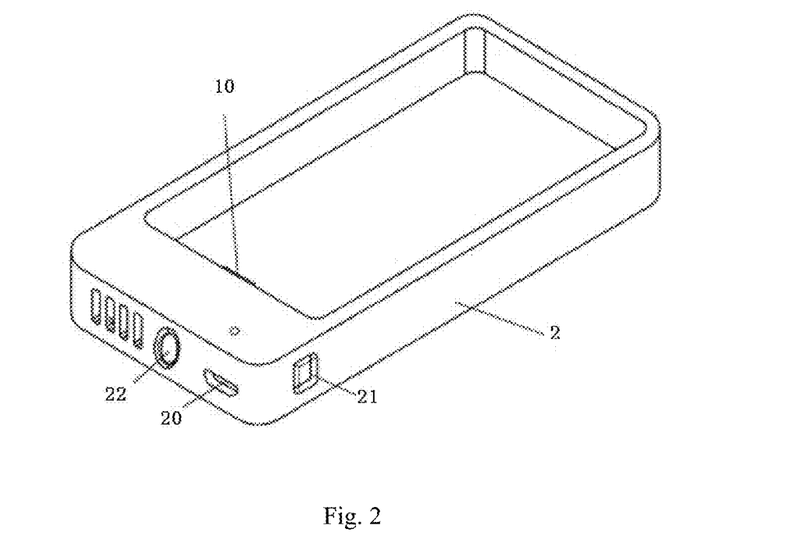
FIG. 2 illustrates a structural view of a shell for a mobile device according to one or more embodiments of the present invention.

FIG. 2 shows a shell 2 that can be applied to a mobile device such as a mobile phone. From FIG. 2 it can be seen that the shell 2 can not only protect the back of the mobile device but also can enclose the side surface of the mobile device so as to provide more perfect protection. In this embodiment, the shell comprises a connector 10 and one or more functional modules (not shown in FIG. 2) attached to the shell 2, and may further comprise a second interface 20 for being electrically connected with an external device. The external device can operate or access a corresponding functional module via the second interface 20. For the sake of simplification, FIG. 2 does not show the respective functional modules and the external device. The mobile device to be mounted in the shell 2 can be connected to the connector 10 via the first interface of the mobile device, thereby realizing electrical connection of the functional module in the shell with the mobile device. The second interface 20 on the shell 2 can provide additional functions for the mobile device or functional modules in the shell. For example, when the shell 2 comprises a functional module such as a rechargeable battery, an external charging device can charge the rechargeable battery via the second interface 20, and when the mobile device is electrically connected with the shell via the connector 10, the external charging device can charge the power supply module in the shell and the battery within the mobile device simultaneously. Meanwhile, such a charging operation does not require taking out the mobile device from the shell 2, which is convenient for the user to use the mobile device, and further promotes the user experience in using the mobile device. On the other hand, when the shell 2 has a storage module, an external device such as a personal computer can operate or access the storage module in the shell 2 via the second interface 20, similarly, it can also operate or access the built-in storage device of the mobile device.

In other embodiments, a plurality of second interfaces corresponding to each functional module respectively can be arranged on the shell 2. Each second interface could be electrically connected with a corresponding functional module via a connecting line, thereby achieving separate access of the external device to each module. Alternatively, as stated above, in some embodiments, as the functional modules are detachably attached to the shell 2, a corresponding functional module can be detached and then electrically connected with the external device. For example, for the power supply module, it can be detached from the shell to be connected with a charging device, so as to be charged.

Figure 3:
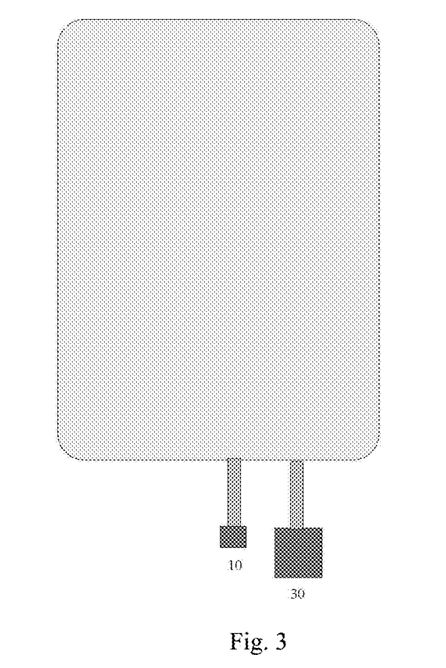
FIG. 3 illustrates a structural view of a shell for a mobile device according to one or more embodiments of the present invention.

In another embodiment, the shell for a mobile device may not comprise a structure for enclosing the side edge of the mobile device, i.e., the shell can only cover a surface of the mobile device, e.g., the back of the mobile device. FIG. 3 schematically shows a structure of such a shell. This shell comprises an USB connector 10 and a second interface. The second interface comprises a second USB interface 30. The second USB interface 30 and the USB connector 10 extend from the shell via connecting lines. Thus, this embodiment also realizes electrical connection of the shell with the mobile device and the external device in a relatively easy manner. For the sake of simplification, FIG. 3 does not show the respective functional modules and corresponding USB connecting lines. In addition, although FIG. 3 shows that the USB connector 10 and the second USB interface 30 extend from the shell via corresponding connecting lines respectively, it can be understood that the USB connector 10 and the second USB interface 30 can also be connected with each other to the same connecting line. For example, the USB connector 10 and the second USB interface 30 can be connected to two ends of the same connecting line. Further, the connecting line can be built in the shell, as long as the ports of the USB connector 10 and the second USB interface 30 are exposed.

Figure 4:
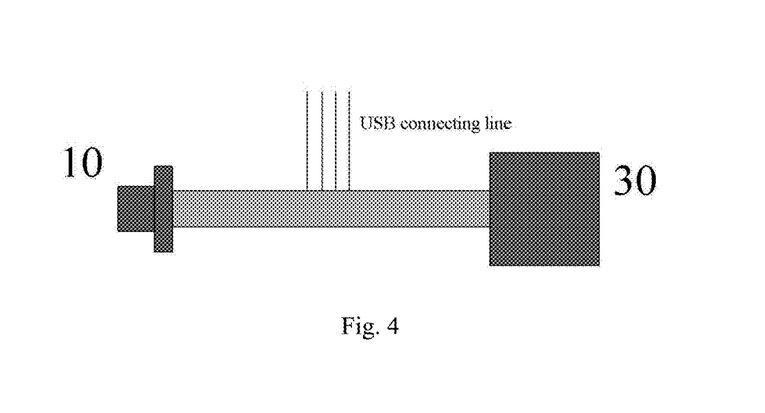
FIG. 4 illustrates the electrical connection of a connector and a second interface with the functional modules of a shell for a mobile device according to one or more embodiments of the present invention.

In short, the shell 2 for a mobile device can be provided with a connector (e.g. the USB connector 10) for being electrically connected with the mobile device and an interface (e.g., the second USB interface 30) for being electrically connected with an external device simultaneously, no matter what their specific shapes or structures are, their principles may be explained with FIG. 4. As shown in FIG. 4, the USB connector 10 of the shell may be electrically connected with the mobile device. The second USB interface 30 of the shell can be electrically connected with the related external device. Whereas functional modules in the shell can be electrically connected with the USB connector 10 or the second USB interface 30 via USB connecting lines derived from the connecting line between the USB connector 10 and the second USB interface 30. The skilled person in the art can understand that connectors for being electrically connected with the mobile device and interfaces for being electrically connected with the external device in other structures or forms can be designed by applying this principle. Moreover, the shell may also have more than one interface for being electrically connected with the external device, for example, a plurality of second USB interfaces.

It should be understood that other additional interfaces or components can be arranged on the shell, so as to meet various requirements of the user. For example, referring to FIG. 2 again, the shell 2 can further comprise a jack 22 for receiving an earphone plug and a control key 21. The jack 22 may correspond to an existing earphone jack on the mobile device. The control key 21 can be designed to perform different functions based on the type of the functional module comprised by the shell. For example, in case the shell 2 comprises a power supply module, the operation of the control key 21 can control, in the event that the shell 2 is electrically connected with the mobile device, whether the power supply module in the shell supplies power to the mobile device, or, control whether an external charging device charges the power supply module. Such selective control can be realized through an auxiliary switch circuit. Such a switch circuit with a selection function is well known for the skilled person in the art, which will not be repeated here. It can be further conceived that in case the electro permanent magnet technology as stated above is used to attach the functional module to the shell, by means of the auxiliary switch circuit, the control key 21 can be designed to control switching between different states of the electro permanent magnet, thereby controlling a corresponding functional module to be fixed to the shell or separated from the shell.

According to an embodiment of the present invention, the above sensing module can comprise a sensor for measuring user body data, motion data or environment data. At present, with people's growing attention and concern to physical health and environmental conditions, people would like to learn and concern personal body data or environment data increasingly. Moreover, various applications (APP) have been developed to calculate or monitor user's body data such as heart rate, blood pressure, etc. in real time, and the environment data, for example the ultraviolet intensity, the concentration of PM2.5, etc. of the environment in which the user locates can also be obtained in real time. In addition, the user's motion data can also be monitored, for example, calculating the step number and speed of walk of the user. Therefore, by arranging a sensor for measuring the user body data, the motion data or the environment data on the shell and combining with related applications, corresponding data acquisition functions can be added for the mobile device in a relatively easy and low-cost manner, which can provide physical health condition, motion condition or environment data for the user in real time. Hence, such a shell could upgrade the functions for an ordinary mobile device, enrich the functions of the mobile device, meet personalized requirements of the user, and promote user experience in using the mobile device.

Figure 5:
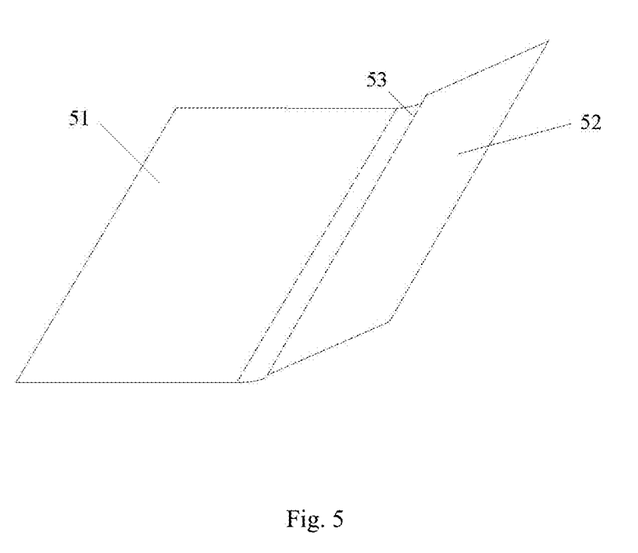
FIG. 5 illustrates a structural view of a shell for a mobile device according to one or more embodiments of the present invention.

In an embodiment, the shell can comprise a substrate for protecting the back of the mobile device. The functional module is attached to the substrate. This embodiment can provide a shell in a single plate form. However, the shell provided by embodiment of the invention is not limited to the form of a single plate structure. In other embodiments, the shell can comprise more than one substrate. For example, the shell can comprise a first substrate and a second substrate capable of protecting the front and the back of the mobile device respectively. The functional module may be attached to one or two of the first substrate and the second substrate. The first substrate and the second substrate may be moveably connected. For example, the shell as shown in FIG. 5 comprises a first substrate 51 and a second substrate 52. A folding structure 53 is provided between the first substrate 51 and the second substrate 52 to enable the first substrate 51 and the second substrate 52 to be moveably connected. In actual applications, one of the first substrate 51 and the second substrate 52 may be designed to be mounted or attached to the mobile device, such that the mobile is placed between the first substrate 51 and the second substrate 52. In this case, one or more functional modules could be located in the first substrate 51, or in the second substrate 52, or distributed in both the first substrate 51 and the second substrate 52. The structure of a single substrate can be simplified and the weight thereof can be reduced by distributing a plurality of functional modules in two substrates.

As stated above, the shell for a mobile device provided by the embodiment of the invention can be designed as a shell for providing protective function for an integral mobile device dedicatedly, for example, the protective sleeve or the protective case for the mobile phone or the panel computer, it can also serve as a shell of the mobile device for protecting the circuits or components within the device directly, i.e., designing the shell provided by embodiments of the invention as a shell necessary for the mobile device. Therefore, according to a further embodiment of the invention, a mobile device is further provided. The mobile device can comprise a shell as described in any of the preceding embodiments. Hence, such a mobile device can have the same or corresponding features and advantages as the preceding embodiments, which will not be repeated here. Such a mobile device can be a handheld electronic device of any type, including but not limited to a mobile phone, a panel computer, a personal digital assistant, a music player, a navigator etc.

The specific embodiments of the invention have been described in detail above. It should be noted that the above embodiments are used for illustration rather than limiting the invention. Moreover, the skilled person in the art could design many alternative embodiments without departing from the scope of the claims attached. In the claims, the word "comprising" or "comprise" does not exclude presence of elements or steps in addition to those listed in the claims. The words "a" or "an" preceding an element does not exclude presence of a plurality of such elements. The mere fact that some features are recited in mutually different dependent claims does not indicate that the combination of these features cannot be used to an advantage.

The invention claimed is:

1. A shell for a mobile device, comprising one or more functional modules and a connector that are fixed to the shell, the functional modules being capable of being electrically connected to the mobile device via the connector and a first interface of the mobile device, for providing a corresponding function for the mobile device,
wherein an inner surface of the shell is provided with one or more grooves corresponding to the functional modules for accommodating the functional modules respectively,
wherein the shell comprises a first substrate and a second substrate capable of protecting a front and a back of the mobile device respectively, the functional modules are fixed to one or two of the first substrate or the second substrate, the first substrate and the second substrate are movably connected.

2. The shell as claimed in claim 1, wherein the functional modules comprises at least one selected from a group consisting of a power supply module, a storage module, a speaker module, and a sensing module.

3. The shell as claimed in claim 2, wherein the first interface comprises an USB interface, and the connector comprises an USB connector matched with the USB interface.

4. The shell as claimed in claim 3, wherein the functional modules are electrically connected with the USB connector via an USB connecting line, the USB connecting line being arranged within the shell or on an inner surface of the shell.

5. The shell as claimed in claim 3, wherein the functional modules are arranged within the shell.

6. The shell as claimed in claim 3, wherein the shell further comprises a second interface for being electrically connected with an external device, the external device being capable of operating or accessing a corresponding functional module via the second interface.

7. The shell as claimed in claim 6, wherein the second interface comprises a second USB interface, and the second USB interface and the USB connector extend from the shell via connecting lines.

8. The shell as claimed in claim 3, wherein the sensing module comprises a sensor for measuring user body data, motion data or environment data.

9. The shell as claimed in claim 1, wherein the shell further comprises a sub-shell for covering all of the functional modules.

10. The shell as claimed in claim 1, wherein the functional module is detachably arranged within the groove.

11. The shell as claimed in claim 1, wherein the shell has a fixing component situated in the groove for fixing a corresponding functional module in the groove.

12. The shell as claimed in claim 1, wherein the groove has a first component, the functional module has a second component, the first component and the second component being capable of cooperating with each other so as to fix the functional module in the groove.

13. The shell as claimed in claim 1, wherein the functional module has an electro permanent magnet, and a magnetic material is provided at a bottom surface or a side surface of the groove or within the shell corresponding to the groove.

14. A mobile device comprising a shell, the shell comprising one or more functional modules and a connector that are fixed to the shell, the functional modules being capable of being electrically connected to the mobile device via the connector and a first interface of the mobile device, for providing a corresponding function for the mobile device,
wherein an inner surface of the shell is provided with one or more grooves corresponding to the functional modules for accommodating the functional modules respectively,
wherein the shell comprises a first substrate and a second substrate capable of protecting a front and a back of the mobile device respectively, the functional modules are fixed to one or two of the first substrate or the second substrate, the first substrate and the second substrate are movably connected.

15. The mobile device as claimed in claim 14, wherein the functional modules comprises at least one selected from a group consisting of a power supply module, a storage module, a speaker module, and a sensing module.

16. The mobile device as claimed in claim 15, wherein the first interface comprises an USB interface, and the connector comprises an USB connector matched with the USB interface.

17. The mobile device as claimed in claim 16, wherein the functional modules are electrically connected with the USB connector via an USB connecting line, the USB connecting line being arranged within the shell or on an inner surface of the shell.

* * * * *